(12) United States Patent
Sase et al.

(10) Patent No.: US 12,187,010 B2
(45) Date of Patent: Jan. 7, 2025

(54) GLASS STRUCTURE, ADHESIVE STRUCTURE, AND METHOD FOR PRODUCING GLASS STRUCTURE

(71) Applicant: AGC Inc., Tokyo (JP)

(72) Inventors: Masayuki Sase, Tokyo (JP); Akira Yamauchi, Tokyo (JP)

(73) Assignee: AGC INC., Tokyo (JP)

( * ) Notice: Subject to any disclaimer, the term of this patent is extended or adjusted under 35 U.S.C. 154(b) by 1064 days.

(21) Appl. No.: 17/018,553

(22) Filed: Sep. 11, 2020

(65) Prior Publication Data

US 2020/0411214 A1    Dec. 31, 2020

Related U.S. Application Data

(63) Continuation of application No. PCT/JP2019/012573, filed on Mar. 25, 2019.

(30) Foreign Application Priority Data

Mar. 27, 2018    (JP) .................... 2018-059522

(51) Int. Cl.
*H05K 1/11*     (2006.01)
*B32B 7/12*     (2006.01)
(Continued)

(52) U.S. Cl.
CPC .......... *B32B 17/10036* (2013.01); *B32B 7/12* (2013.01); *B32B 17/10165* (2013.01);
(Continued)

(58) Field of Classification Search
CPC ................ B32B 17/10036; B32B 7/12; B32B 17/10165; B32B 17/10293;
(Continued)

(56) References Cited

U.S. PATENT DOCUMENTS 4,488,033 A    12/1984  Trachtenberg
4,606,159 A *   8/1986  Kunert .................... B60J 10/30
                                           52/716.5
(Continued)

FOREIGN PATENT DOCUMENTS

DE    10030066.4 B4    12/2001
JP     3919391 B2       5/2007
(Continued)

OTHER PUBLICATIONS

International Searching Authority, "International Search Report," issued in connection with International Patent Application No. PCT/JP2019/012573, dated Jun. 11, 2019.
(Continued)

*Primary Examiner* — Ishwarbhai B Patel
(74) *Attorney, Agent, or Firm* — Foley & Lardner LLP

(57) ABSTRACT

A glass structure includes a glass plate; a connecting member placed on one surface of the glass plate, and is electrically connected to a conductor placed on the glass plate or placed in the vicinity of the glass plate, the connecting member including a connecting portion at one end thereof and a power supply portion at the other end thereof, and a portion other than the connecting portion and the power supply portion are covered by a resin portion; wherein the glass structure is adhered to a predetermined portion by an adhesive; and the glass structure including a base layer extending as a strip along the edge of the glass plate is placed on the surface of the glass plate and the surface of the resin portion of the connecting member, wherein the base layer including a resin primer layer, a glass primer layer and a sealant layer.

11 Claims, 5 Drawing Sheets

(51) Int. Cl.
*B32B 17/10* (2006.01)
*B60J 1/00* (2006.01)
*B60J 10/34* (2016.01)
*B60R 16/03* (2006.01)
*C09J 5/00* (2006.01)
*C09J 175/04* (2006.01)
*H01B 5/14* (2006.01)
*H02G 3/22* (2006.01)
*H05K 1/14* (2006.01)
*H05K 1/18* (2006.01)
*B60R 16/02* (2006.01)
*H05K 1/03* (2006.01)
*H05K 1/16* (2006.01)

(52) U.S. Cl.
CPC ......... *B32B 17/10293* (2013.01); *B60J 1/001* (2013.01); *B60J 1/004* (2013.01); *B60J 10/34* (2016.02); *B60R 16/03* (2013.01); *C09J 5/00* (2013.01); *C09J 175/04* (2013.01); *H01B 5/14* (2013.01); *H02G 3/22* (2013.01); *H05K 1/11* (2013.01); *H05K 1/14* (2013.01); *B32B 2255/26* (2013.01); *B32B 2605/00* (2013.01); *B60R 16/0207* (2013.01); *C09J 2475/00* (2013.01); *H05K 1/0393* (2013.01); *H05K 1/16* (2013.01); *H05K 1/18* (2013.01)

(58) Field of Classification Search
CPC ............ B32B 2255/26; B32B 2605/00; B32B 2250/03; B32B 2250/24; B32B 27/08; B32B 2250/40; B32B 2307/412; B32B 2419/00; B32B 2605/006; B32B 3/08; B32B 27/306; B32B 27/36; B32B 27/365; B60J 1/001; B60J 1/004; B60J 10/34; B60R 16/03; B60R 16/0207; C09J 5/00; C09J 175/04; C09J 2475/00; C09J 2400/143; C09J 201/00; H01B 5/14; H02G 3/22; C09D 5/00; C09D 201/00
See application file for complete search history.

(56) References Cited

U.S. PATENT DOCUMENTS

| | | | | |
|---|---|---|---|---|
| 4,635,415 | A | * | 1/1987 | Schumacher ....... B29C 65/3444 156/927 |
| 4,707,591 | A | * | 11/1987 | Sprenger ................. H05B 3/06 200/61.81 |
| 5,864,996 | A | * | 2/1999 | Veldman .................. B60J 10/70 52/204.597 |
| 6,348,123 | B1 | | 2/2002 | Nakata et al. |
| 9,171,658 | B2 | * | 10/2015 | Reul ....................... H01Q 1/52 |
| 9,564,674 | B2 | * | 2/2017 | Dai ...................... H01Q 1/1271 |
| 2007/0031644 | A1 | * | 2/2007 | Kasahara ................ B60J 10/45 428/192 |

FOREIGN PATENT DOCUMENTS

| | | |
|---|---|---|
| JP | 4002010 B2 | 10/2007 |
| JP | 2014-514836 A | 6/2014 |
| WO | WO-01/99472 A1 | 12/2001 |

OTHER PUBLICATIONS

International Searching Authority, "Written Opinion," issued in connection with International Patent Application No. PCT/JP2019/012573, dated Jun. 11, 2019.

* cited by examiner

GLASS STRUCTURE, ADHESIVE STRUCTURE, AND METHOD FOR PRODUCING GLASS STRUCTURE

CROSS-REFERENCE TO RELATED APPLICATIONS

This U.S. non-provisional application is a continuation application of and claims the benefit of priority under 35 U.S.C. § 365(c) from PCT International Application PCT/JP2019/012573 filed on Mar. 25, 2019, which is designated the U.S., and is based upon and claims the benefit of priority of Japanese Patent Application No. 2018-059522 filed on Mar. 27, 2018, the entire contents of which are incorporated herein by reference.

TECHNICAL FIELD

The present invention relates to a glass structure, an adhesive structure, and a method for producing the glass structure.

BACKGROUND OF THE INVENTION

Conventionally, as window glass for vehicles, buildings, or the like, glass plates that are equipped with conductors including in antennas, heaters or the like and connecting members electrically connected to such conductors are known. For example, Patent Document 1 discloses the structure having a glass plate 4, an antenna structure 5 provided inside or outside the glass plate 4, and a connecting member (flat conductor) 2 being pulled out from the end surface of the glass plate 4 and folded back to be placed on one surface of the glass plate 4.

RELATED-ART DOCUMENT

Patent Documents

Patent Document 1: Japanese Unexamined Patent Application Publication (Translation of PCT Application) No. 2014-514836

SUMMARY OF THE INVENTION

Problems to be Solved by the Invention

When the structure as disclosed in Patent Document 1 is attached to a predetermined member, an adhesive is applied to the surface of the laminated glass including the surface of the connecting member, and the laminated glass structure is pressed and adhered to the predetermined member (FIG. 1A, etc. of Patent document 1). At that time, a glass primer is often applied to the surface of the glass, but the adhesion between the surface of the connecting member and the adhesive is not necessarily improved by the glass primer. Therefore, the configuration as disclosed in Patent Document 1 may not exhibit sufficient for adhesive strength in the portion where the connecting member is arranged.

In view of the above points, in one aspect of the present invention, an object of the present invention is to provide a glass structure having sufficient adhesive strength even in a portion where a connecting member is provided, when the glass structure having the connecting member provided on the surface of the glass plate is adhered to a predetermined member.

Means for Solving the Problems

A glass structure contains a glass structure including a glass plate; a connecting member which is placed on one surface of the glass plate, and is electrically connected to a conductor placed on the glass plate or placed in the vicinity of the glass plate, the connecting member including a connecting portion at one end thereof and a power supply portion at the other end thereof, and a portion other than the connecting portion and the power supply portion are covered by a resin portion; wherein the glass structure is adhered to a predetermined portion by an adhesive; and the glass structure including a base layer extending as a strip along the edge of the glass plate is placed on the surface of the glass plate and the surface of the resin portion of the connecting member, wherein the base layer including a resin primer layer formed on the surface of the resin portion of the connecting member, and a glass primer layer formed on the resin primer layer and the surface of the glass plate.

Effect of the Invention

According to one aspect of the present invention, the present invention is capable of providing a glass structure having sufficient adhesive strength even in a portion where a connecting member is provided, when the glass structure having the connecting member provided on the surface of the glass plate is adhered to a predetermined member.

DETAILED DESCRIPTION

Figure 1A:
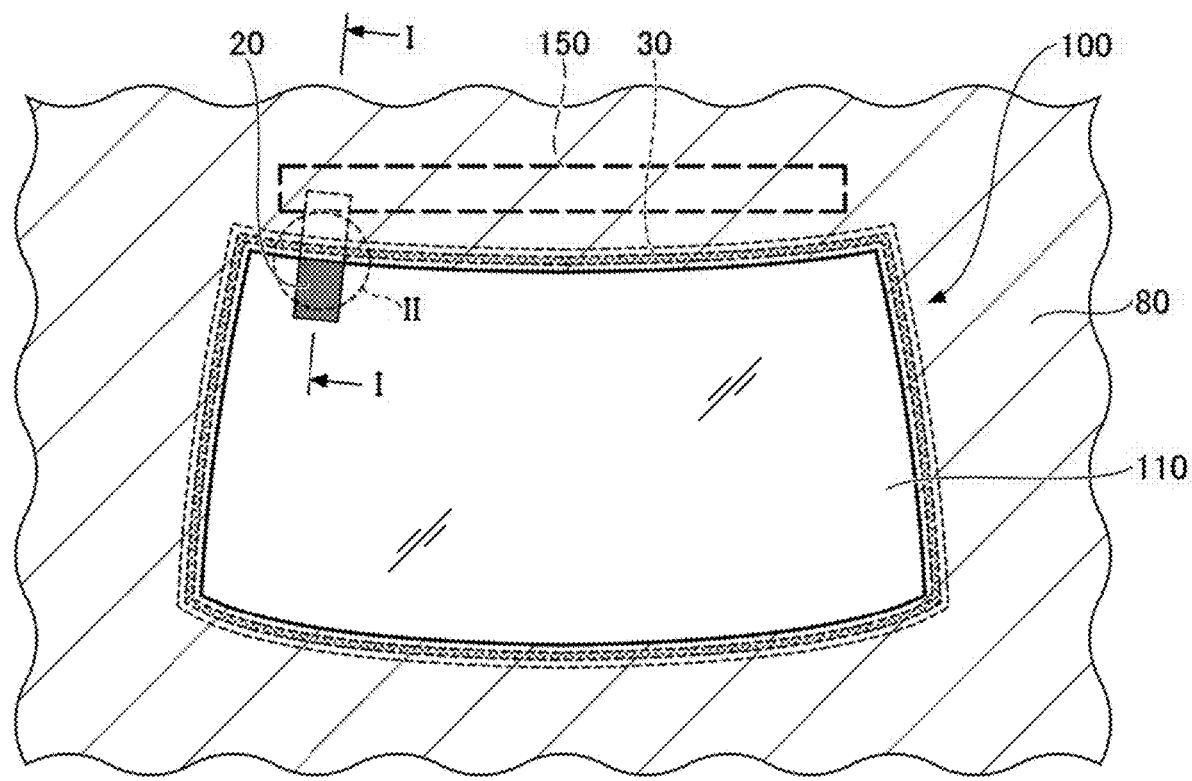
FIG. 1A is a plan view illustrating the state where the glass structure is attached in one aspect of the present invention.

Hereinafter, embodiments for carrying out the present invention will be described. In each drawing, the same or corresponding configurations may be denoted by the same or corresponding reference numerals, and description thereof may be omitted. Moreover, the present invention is not limited to the following embodiments.

FIG. 1A depicts a schematic plan view of a glass structure 100 according to an embodiment of the present invention.

FIG. 1A depicts an example in which the glass structure 100 is used as a window glass of a vehicle. FIG. 1A is a figure illustrating a state in which a glass structure 100 is attached to a window frame 80 of a vehicle, and the window glass is viewed from the interior side (inside) of the vehicle. As illustrated in FIG. 1A, the glass structure 100 is placed so that its peripheral edge overlaps with the frame 80. The frame 80 may be formed by metal, plastic, or the like.

Figure 1B:
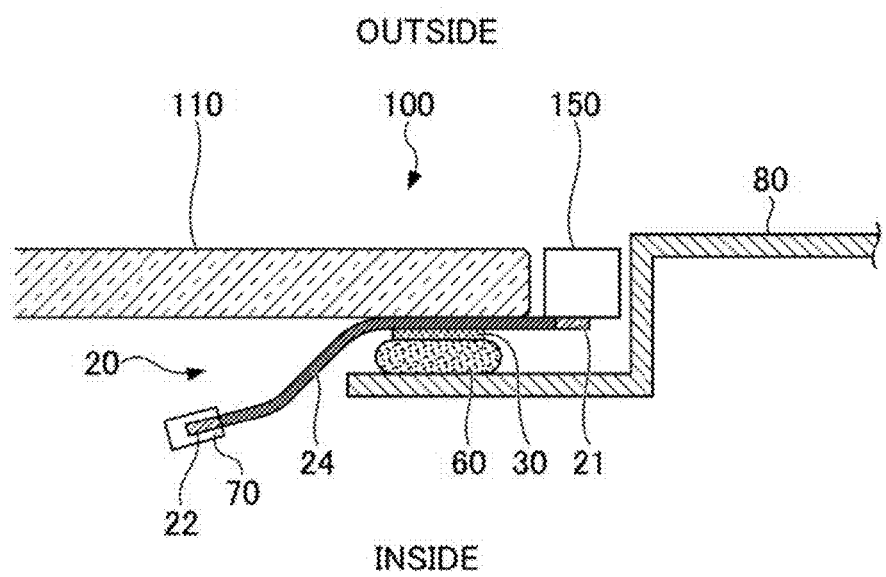
FIG. 1B is a cross-sectional view of the line I-I in FIG. 1A.
Figure 1C:
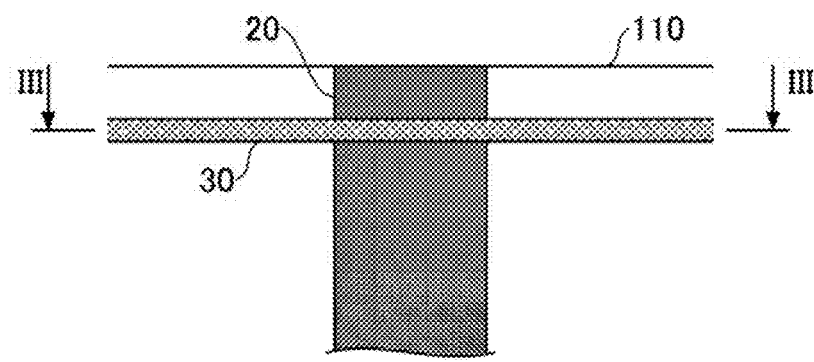
FIG. 1C is an enlarged view of the part II in FIG. 1A.

FIG. 1B depicts a cross-sectional view of the line I-I of FIG. 1A. Further, FIG. 1C depicts an enlarged view of a portion II in FIG. 1A. As illustrated in FIGS. 1A and 1B, the glass structure 100 includes a glass plate 110 and a connecting member 20 placed on one surface of the glass plate 110.

The glass plate 110 used in the glass structure 100 may be soda lime silicate glass, aluminosilicate glass, borate glass, lithium aluminosilicate glass, borosilicate glass, or the like. The glass plate 110 may be a non-tempered, and may have been subjected to strengthening by air-cooling or chemical strengthening treatment. Non-tempered glass is formed by shaping molten glass into a plate shape, followed by gradually cooling the molten glass. Tempered glass is formed by forming a compressive stress layer on the surface of non-tempered glass. For example, the tempered glass may be air-cooled tempered glass, in which the uniformly heated glass plate is rapidly cooled from the temperature near the softening point, and a compressive stress is generated on the glass surface due to the temperature difference between the glass surface and the interior of the glass. As a result, the glass surface may be strengthened. On the other hand, when the tempered glass is chemically tempered, the glass surface may be strengthened by generating compressive stress on the glass surface by an ion exchange method or the like. The glass plate 110 may be a glass that absorbs ultraviolet rays or infrared rays, and is preferably transparent. However, the glass may also be colored to the extent that the transparency of the glass is not impaired. The glass plate 110 may be organic glass. Examples of the organic glass include transparent resins such as polycarbonate or the like. The shape of the glass plate 110 is not particularly limited to a rectangular shape, and may be formed in various shapes and curvatures. Examples of bend molding of glass plate include gravity molding, press molding or the like. The method for forming the glass plate is not particularly limited, but for example, a glass plate formed by the float method or the like is preferably applied.

The connecting member 20 placed on one surface of the glass plate 110 may include a connecting member 21 electrically connected to the conductor 150 at one end and a power supply portion 22 capable of supplying electric power at the other end. The power supply portion 22 may be connected to a power supply, a signal circuit, or the like via the connector 70 or the like. The portions of the connecting member 20 other than the connecting portion 21 and the power supply portion 22 are covered with a resin portion 24 which is a dielectric (insulator). It is preferable that the portions other than the connecting portion 21 and the power supply portion 22 are substantially covered with the resin portion 24. It is more preferable that the portions other than the connecting portion 21 and the power supply portion 22 are covered with the resin portion 24.

The resin portion 24 may be a thermosetting resin or a thermoplastic resin. Examples of the resin include polyester resins such as polyethylene terephthalate, polyethylene naphthalate, and polybutylene terephthalate; polyamide resins such as nylon 6, nylon 66, and nylon 610; polyimide resins such as polyimide, polyamide imide, and polyether imide; fluorine resins; polyether sulfone; polyether ketone; polyether sulfide; polyarylate; polyester ether; wholly aromatic polyamide; polyaramid; polypropylene; polycarbonate; or the like. In the present embodiment, a polyimide resin such as polyimide can be preferably used. However, the resin used in the resin portion 24 is not particularly limited as long as it is a material having insulating properties, flexibility, and heat resistance.

The connecting member 20 may have an assembly in which one or a plurality of conducting wires (conductor paths) are bundled and covered with the above-mentioned resin portion 24. Further, the connecting member 20 may be a member having a circular, polygonal or other cross-section, or may be a thin foil-like member having a plurality of juxtaposed conducting wires covered with a resin portion 24 (hereinafter referred to as a flat harness or a flat cable). FIG. 1A to 1C depict examples in which a flat harness is used as the connecting member 20.

The cross-sectional area of the connecting member 20 is preferably about 0.5 mm$^2$ to 5.0 mm$^2$, but can be appropriately set depending on the required amount of electric current. The size of the cross-section can also be set as appropriate according to the required amount of electric current.

As described above, the connecting member 20 is connected to the conductor 150 via the connecting portion 21 provided at one end. The conductor 150 may be included in an electrical component such as an antenna, a heater, a lighting member, or a wiring member therefor. In the example of FIG. 1, the conductor 150 is illustrated as the conductor included in the high mount strap lamp. The conductor 150 may be provided on either or both surfaces of the glass plate 110, or on the end surface thereof so as to be in contact with the glass plate 110. Additionally, the conductor 150 may be provided in the vicinity of the glass plate 110 so that the conductor 150 does not necessarily contact with the glass plate as illustrated.

As illustrated in FIGS. 1A and 1B, the connecting member 20 is placed on the one surface side of the glass plate 110. When the glass structure 100 is used as, for example, a window glass of a vehicle or a building, the side on which the connection member 20 is placed is preferably the interior side of the vehicle or inside of the building.

The glass structure 100 further includes a base layer 30 in addition to the glass plate 110 and the connecting member 20 described above. Then, as illustrated in FIG. 1B, the glass structure 100 can be bonded to the frame 80 via the adhesive 60 at the position where the base layer 30 is provided. That is, the base layer 30 is formed in a portion to which the adhesive is applied when the glass structure 100 is attached to a predetermined member (the frame 80 in this embodiment). Because the glass structure 100 includes the base layer 30, the adhesiveness between the glass structure 100 and the adhesive 60 can be improved. Note that the adhesive 60 may be a urethane adhesive, for example.

In the example of FIG. 1, the connection member (flat harness) 20 is provided near the upper left end in the figures. However, the position where the connecting member 20 is placed is appropriately determined depending on the type of conductor provided, the configuration of the glass structure 100, the adhesive structure between the glass structure 100 and a predetermined member. The position where the connecting member 20 is placed may be anywhere on the glass plate 110. Further, a plurality of connecting members 20 may be provided on the glass plate 110.

The base layer 30 is formed on the surface of the glass plate 110 on which the connecting member 20 is placed, as a band having a predetermined width along the edge of the glass plate 110. In the illustrated example, the base layer 30 is formed at a predetermined distance from the edge of the glass plate 110 in a plan view, but the base layer 30 may be formed without having a predetermined distance from the edge of the glass plate 110. Further, although the base layer 30 is formed in a ring shape over the peripheral edge of the glass plate 110, the base layer 30 may have a discontinuous portion depending on the formation of adhesiveness between the glass structure 100 and a predetermined member. However, in particular, as illustrated in FIG. 1C, the base layer 30 is preferably formed as a continuous band at least on the surface of the connecting member 20 and on the surface of the glass plate 110 near both sides of the connecting member 20 with a predetermined length. For example, the base layer 30 is preferably formed as a continuous band in a portion. The portion is preferably laid in an area from about 0 to 5 mm away from the edge of one side of the connecting member 20 to about 0 to 5 mm away from the edge of the other side of the connecting member 20, when viewed in a plan view.

The width of the base layer 30 formed can be 3 to 30 mm, and more preferably 8 mm to 20 mm. The width of the base layer 30 may be constant or may vary depending on the location.

As described above, the base layer 30 is preliminary formed on the glass structure 100 according to the present embodiment. Therefore, when the glass structure 100 is attached to a predetermined member, the user who obtains the glass structure 100 according to the present embodiment does not need to apply a primer or the like to at least the connecting member 20 and the vicinity thereof.

The base layer 30 may include a primer having a predetermined pot life. The base layer 30 can have a pot life of 12 hours or more, preferably more than 24 hours, which is required according to the JIS standard described later.

Figure 2A:
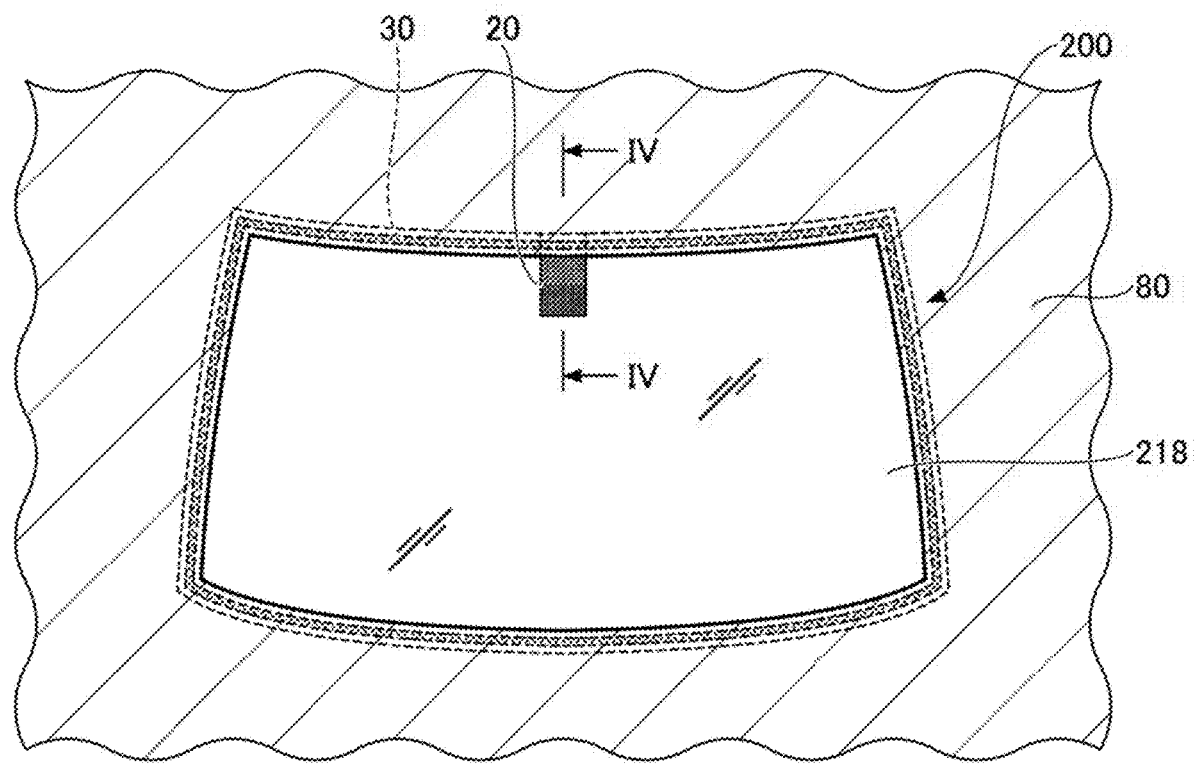
FIG. 2A is a figure which depicts the state by which the glass structure is attached in one aspect of the present invention.
Figure 2B:
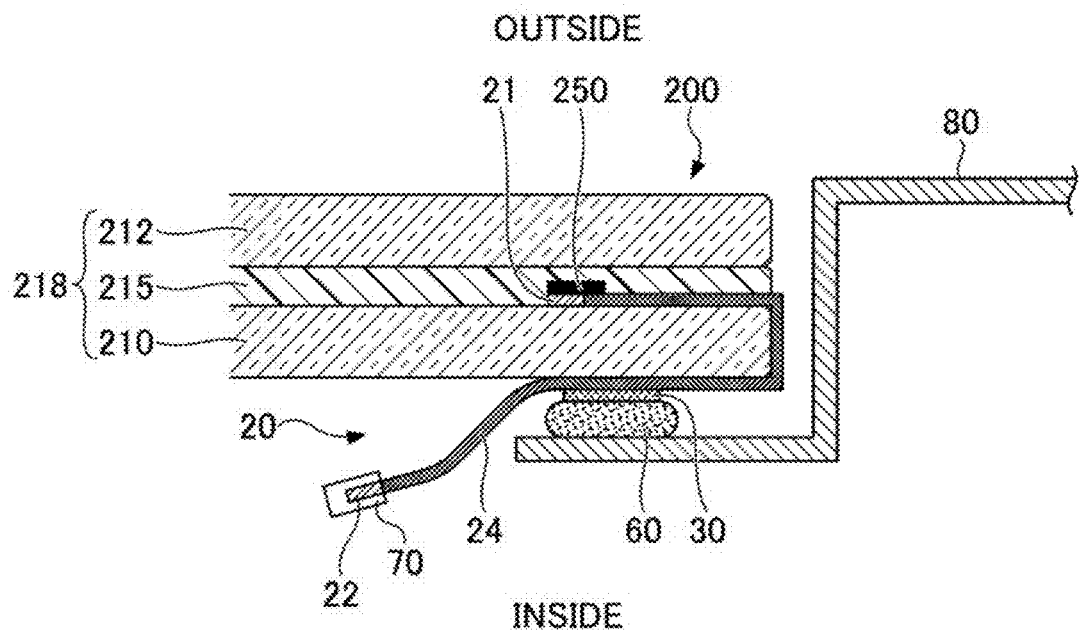
FIG. 2B is a cross-sectional view of the line IV-IV of FIG. 2A.

FIG. 2A depicts a schematic plan view of a glass structure 200 according to an embodiment of the present invention. Further, FIG. 2B depicts a cross-sectional view of the line IV-IV of FIG. 2A. In the same manner as the glass structure 100 (FIG. 1), the glass structure 200 includes a glass plate 210 and a connecting member 20 placed on one surface of the glass plate 210. However, the glass structure 200 differs from the glass structure 100 in that the glass structure 200 contains the laminated glass 218 formed of the glass plate and another glass plate 212 via the intermediate film.

As the glass plate 210 and the other glass plate 212 constituting the laminated glass 218, the same glass as the above-mentioned glass plate 110 can be used. An intermediate film 215 such as polyethylene terephthalate, polyvinyl butyral, or the like may be provided between the glass plate 210 and the other glass plate 212 that form the laminated glass 218.

The conductor 250 may be disposed on either surface of the laminated glass 218, the inside of the laminated glass 218, or both of them. For example, as illustrated in FIG. 2B, the conductor 250 may be placed between the glass plate 210 and the other glass plate 212. In that case, the conductor 250 may be placed between the glass plate 210 and the intermediate film 215.

The structure of the connecting member 20 itself in the glass structure 200 can be the same as that of the connecting member 20 described in the glass structure 100. FIGS. 2A and 2B also depict examples in which a flat harness is used as the connecting member 20.

In the glass structure 200, the connecting member (flat harness) 20 is pulled out from the end surface of the laminated glass 218, as illustrated in FIGS. 2A and 2B. In this case, the connection member 20 may be pulled out from, for example, between one glass plate 210 and the intermediate film 215 that constitute the laminated glass 218, as illustrated in FIG. 2B. The connection member 20 pulled out from the end surface of the laminated glass 218 is folded back to the one surface side (the front surface side of the paper surface in FIG. 2A) of the laminated glass 218 at the end portion of the laminated glass 218. More specifically, one end of the connecting member 20 including the connecting portion 21 is placed between the glass plate 210 and the other glass plate 212, and the other end of the connecting member 20 including the power supply portion 22 is located outside the laminated glass 218, and a portion of the connecting member 20 is folded at the end of the laminated glass 218. When the glass structure 200 is used as, for example, window glass of vehicles or buildings, the side on which the connection member 20 is placed is preferably the interior side of the vehicles or the inside of the buildings.

However, the arrangement of the connecting member 20 in the glass structure 200 is not limited to the illustrated example. The connection member 20 may be drawn from a notch formed in one surface of the laminated glass 218, may be bent, and may be placed on the one surface of the laminated glass 218. Further, when the conductor 250 is placed on one surface of the laminated glass 218 or when a wireless system is used, the connection member 20 is placed on one surface of the laminated glass 218 without being pulled out from the laminated glass 218.

The glass structure 200 includes a base layer 30 in addition to the laminated glass 218 and the connecting member 20 described above. The configuration (size, shape, and arrangement) and function of the base layer 30 can be the same as those described for the base layer 30 in the glass structure 100.

Next, a more detailed description of the base layer in the glass structure according to the present embodiment will be described. In the following description (FIGS. 3 to 9), the glass structure 1A (first embodiment) and the glass structure 1B (second embodiment) are either the glass structure 100 or the glass structure 200, respectively. That is, the base layer 30A (first embodiment) and the base layer 30B (second embodiment) can correspond to either the base layer 30 in the glass structure 100 of the above or the base layer 30 in the glass structure 200 of the above, respectively. Further, in the following description, the glass 10 may be either the glass plate 110 or the laminated glass 218. Note that, for simplification of description, the detailed configuration of the glass 10 is not illustrated. Further, the following glass structure 1A and glass structure 1B are based on an example in which a flat harness having a small thickness and a predetermined width is used as the connecting member 20.

First Embodiment

Figure 3:
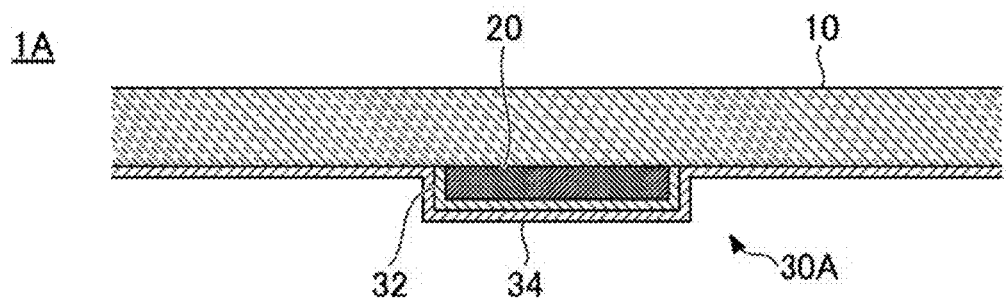
FIG. 3 is a cross-sectional view of the glass structure of the first embodiment.

FIG. 3 depicts a schematic cross-sectional view of the glass structure 1A according to the first embodiment. This cross-sectional view corresponds to the cross-sectional view of the line III-III in FIG. 1C. As illustrated in FIG. 3, the glass structure 1A includes a glass 10, a flat harness (connecting member) 20 placed on one surface side (lower side in the drawing) of the glass 10, and a base layer 30A which is formed on the glass 10 and the flat harness 20. The base layer 30A has a resin primer layer 32 applied to the surface of the flat harness 20, that is, all surfaces (the exposed surface of the flat harness 20) except the surface where the flat harness 20 faces the glass 10. Furthermore, the base layer 30A has a glass primer layer 34 formed on the surface of the resin primer layer 32 and the glass 10 on both sides of the resin primer layer 32. The portion of the connecting member 20 where the resin primer layer 32 is formed is covered with a resin portion.

Conventionally, when a glass structure is attached to a predetermined member by using a primer, a glass primer is often used alone as a base layer. That is, in the conventional configuration, the glass primer is directly applied onto the flat harness. However, the adhesiveness between the resin of the covering material of flat harness and the glass primer is not always favorable. Therefore, when the glass structure is adhered to a predetermined member via the adhesive, the adhesive strength between the flat harness and the adhesive was not favorable.

On the other hand, according to the present embodiment, the resin primer layer 32 is formed on the surface of the flat harness 20. That is, the resin primer layer 32 is formed on the surface other than the surface facing the glass 10 (the surface of the flat harness 20 opposite to the glass 10 and the end surfaces of both ends of the flat harness 20). Then, the glass primer layer 34 is formed on the portion where the resin primer layer 32 is applied.

The resin primer used for the resin primer layer 32 improves the adhesiveness between the resin portion covering the surface of the flat harness 20 and the layer (adhesive, primer, sealant, etc.) provided on the resin portion. The resin primer may also improve the adhesiveness between the resin on the surface of the flat harness 20 and the glass primer layer 34 formed around the resin.

The glass structure 1A as illustrated in FIG. 3 can be produced by placing the flat harness 20 on one surface of the glass 10, followed by forming the base layer 30A on the surface of the glass 10 and on the surface of the flat harness 20 in which the strip of the base layer 30A extends along the edge of the glass. In this case, the formation of the base layer 30A may include forming the resin primer layer 32 on the surface of the flat harness 20 and forming the glass primer layer 34 on the surface of the resin primer layer 32 and the glass 10.

The resin primer used in the resin primer layer 32 can be appropriately selected according to the type of material forming the covering material of the flat harness 20. Specific examples of the resin primer include RC-50E, M-300 (manufactured by Yokohama Rubber Co., Ltd.), 435-98 (manufactured by Sunstar Engineering Inc.) and #5404 (manufactured by Dow Inc.). When the coating material of the flat harness 20 contains a polyimide resin, RC-50E or 435-98 is preferably used as the resin primer of the resin primer layer 32.

The glass primer used for the glass primer layer 34 can be appropriately selected according to the types of the glass 10 and the types of adhesive used for attachment to a member. Specific examples of the glass primer include MS-90, G-200 (manufactured by Yokohama Rubber Co., Ltd.), 435-41 (manufactured by Sunstar Engineering Inc.), #5550, #5500 (manufactured by Dow Inc.).

Thus, at least the surface of the flat harness 20 is formed with two types of primer layers, that is, the resin primer layer 32 and the glass primer layer 34. Therefore, when the glass structure 1A is adhered to a predetermined member via an adhesive, two types of resin primer layer 32 and glass primer layer 34 are provided between the flat harness 20 and the adhesive. As a result, the adhesive strength in the portion where the flat harness 20 is placed can be improved.

The width of the glass primer layer 34 may be smaller or larger than the width of the resin primer layer 32 in plan view, and may be the same as the width of the resin primer layer 32. Further, the resin primer layer 32 and the glass primer layer 34 may be formed in different regions. In the portion where an adhesive is applied at the time of attachment, the resin primer layer 32 and the glass primer layer 34 are preferably laminated.

The materials of the resin primer layer 32 and the glass primer layer 34 included in the base layer 30A can be selected according to the types of adhesive used when attaching the glass structure 1A. For example, when a urethane adhesive is used as the adhesive, the resin primer used for the resin primer layer 32 is one that enhances the adhesion between the urethane and the covering material of the flat harness 20, and the glass primer used for the glass primer layer 34 in one that enhances the adhesion between the urethane and the glass.

The glass primer used for the glass primer layer 34 can be a long-life primer. In the present specification, the "long-life primer" or the "long-life primer" has a pot life (a time during which the prepared primer remains usable, also referred to as a pot life) is 8 hours or more. The pot life can be the time determined in accordance with JIS K6870. For example, a pot life may be the time determined by using a tensile tester, in accordance with JIS K6870 6.7.

When the glass primer layer 34 is formed by using the long-life primer, the pot life of the outermost layer of the base layer 30A is long, therefore, the pot life of the entire base layer 30A is also long. Therefore, the time from the completion of producing the glass structure 1A by forming the base layer 30A to the attachment of produced glass structure 1A with an adhesive can be longer. That is, the manufacturer can secure a longer time from the completion of the production of the glass structure 1A to providing the produced glass structure to the user. In addition, after the user obtained the glass structure 1A, the user may attach the glass structure 1A within the period of the pot life. Therefore, the user can secure a longer time from the acquisition of the glass structure to the installation work. As described above, the degree of freedom in time can be increased by forming the glass primer layer 34 with the long-life primer.

The pot life of the glass primer used in the glass primer layer 34 is not particularly limited as long as the pot life is 8 hours or more as described above. The pot life is preferably 12 hours or more and more preferably more than 24 hours. Although the upper limit of the pot life is not particularly limited, the pot life can be 60 days or less, preferably 50 days or less, and more preferably 30 days or less. Examples of long-life glass primers used for the glass primer layer 34 include GP-402 (manufactured by Sunstar Engineering Inc.) and PC-3 (manufactured by Yokohama Rubber Co., Ltd.).

Figure 4:
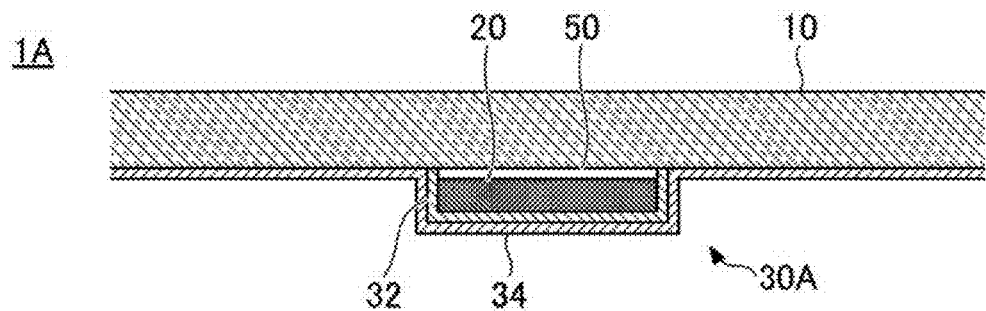
FIG. 4 is a cross-sectional view of the glass structure of the first embodiment.

FIG. 4 depicts a modification of the glass structure 1A. In the modification illustrated in FIG. 4, the flat harness 20 is adhered to the glass 10. More specifically, when the flat harness 20 is placed along one surface of the glass 10 by folding back the flat harness 20 to the one surface side of the glass 10, then the flat harness 20 is adhered to the glass 10. In the illustrated example, a double-sided adhesive tape (double-sided adhesive tape) 50 is used to adhere the flat harness 10 to the glass 10. The double-sided adhesive tape (double-sided adhesive tape) has adhesiveness (or tackiness) on both sides thereof. In the illustrated example, the double-sided adhesive tape is provided on the surface of the glass 10 where the flat harness 20 is not exposed (the non-exposed surface of the flat harness 20).

Because the flat harness 20 and the glass 10 are adhered to each other in this manner, the flat harness 20 and the glass 10 can be placed in close contact with each other. Therefore, the portion where the flat harness 20 is placed and the periphery thereof enhances the air tightness and the liquid tightness. Here, the type of adhesion between the flat harness 20 and the glass 10 is not limited to the double-sided adhesive tape 50, and a known type of adhesion such as a thermosetting tape, an adhesive such as urethane or epoxy can be used. Further, the adhesion between the flat harness 20 and the glass 10 can be formed by interposing a resin primer layer, a glass primer layer, or both, or another adhesive composition or the like.

In the glass structure 1A as an example illustrated in FIG. 4, after the flat harness 20 is placed on one surface of the glass 10 via the double-sided adhesive tape 50, a resin primer layer 32 is formed by applying a resin primer to the exposed surface of the flat harness 20 where the double-sided adhesive tape 50 is not provided, the glass primer layer 34 is formed by applying glass primer to the surface of the resin primer layer 32 and the surface of the glass 10 on both sides of the resin primer layer 32. As a result, the glass structure 1A of FIG. 4 is produced.

Figure 5:
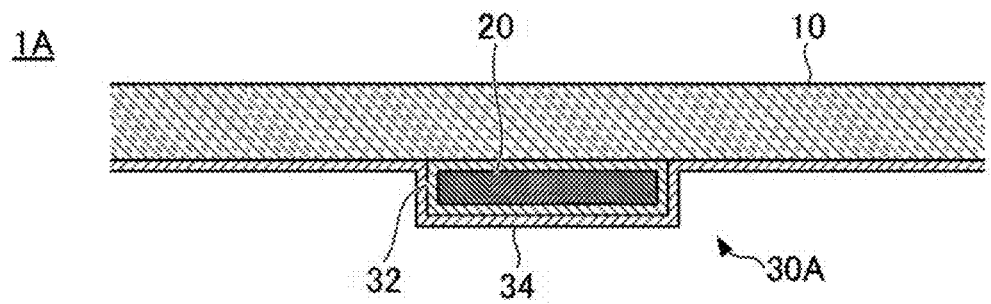
FIG. 5 is a cross-sectional view of the glass structure of the first embodiment.

FIG. 5 depicts another modification of the glass structure 1A. In the example illustrated in FIG. 5, the resin primer layer 32 is formed on not only the surface of the flat harness 20 which does not face to the glass 10 and the end surfaces of both side of the flat harness 20 but also the surface face to the glass 10. That is, the resin primer layer 32 is formed around the flat harness 20. In the example of the glass structure 1A illustrated in FIG. 5, for example, after the resin primer layer 32 is formed on the entire periphery of the flat harness 20, the flat harness 20 is placed on the surface of the glass 10, and then the glass primer layer 34 is formed. As a result, the glass structure 1A of FIG. 5 is produced.

Because the resin primer layer 32 is formed between the flat harness 20 and the glass 10 as described above, the adhesiveness between the flat harness 20 and the glass 10 can be enhanced.

In the example of FIG. 5, after the resin primer layer 32 is formed around the flat harness 20, a double-sided adhesive tape can be further provided between the flat harness 20 and the glass 10 when the flat harness 20 is placed on one surface of the glass 10.

Figure 6:
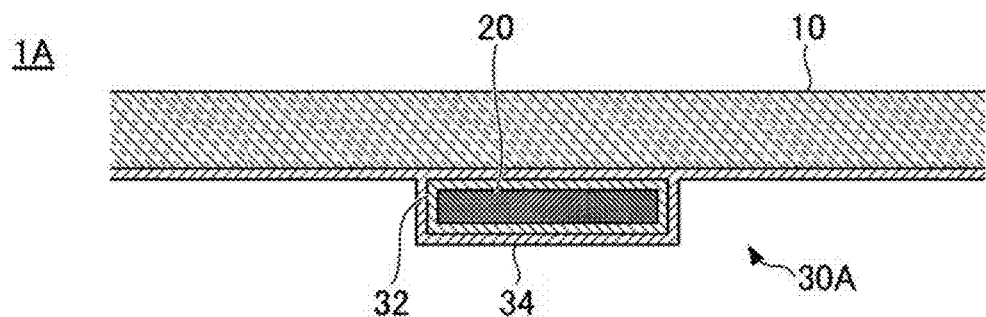
FIG. 6 is a cross-sectional view of the glass structure of the first embodiment.

FIG. 6 depicts another modification of the glass structure 1A. The resin primer layer 32 is similarly formed around the flat harness 20 as the example of FIG. 5. However, it is different from FIG. 5 in the point such that the glass primer layer 34 is provided between the glass 10 and the flat harness 20 in the example of FIG. 6.

The base layer 30A in the glass structure 1A as an example illustrated in FIG. 6 is, for example, produced by applying a glass primer to form the glass primer layer 34, then, placing the flat harness 20 having the resin primer around the flat harness 20 on the glass primer layer 34, and applying a glass primer on the surface of the flat harness 20 (on the surface of the resin primer layer 32). As a result, the base layer 30A of FIG. 6 is produced.

In the example illustrated in FIG. 6, two layers, such as a glass primer layer 34 and a resin primer layer 32, are present between the glass 10 and the flat harness 20. As a result, the adhesiveness between the glass 10 and the flat harness 20 can be enhanced, and the airtightness and liquid tightness of the folded back portion and the vicinity of the folded back portion in the flat harness 20 can be improved.

Second Embodiment

Figure 7:
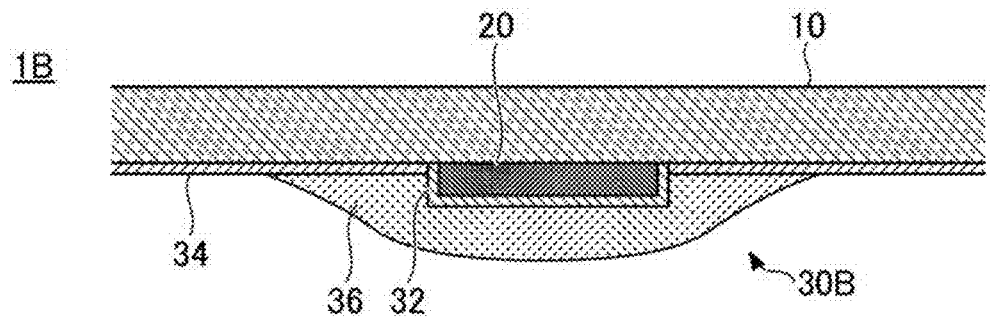
FIG. 7 is a cross-sectional view of the glass structure of the second embodiment.

FIG. 7 depicts a schematic cross-sectional view of the glass structure 1B according to the second embodiment. This cross-sectional view corresponds to the cross-sectional view of the line III-III in FIG. 1C. The second embodiment will also be described based on an example in which a flat harness having a small thickness and a predetermined width is used as the connecting member 20.

As illustrated in FIG. 7, in the same manner as the glass structure 1A (FIGS. 3 to 6), the glass structure 1B of the second embodiment contains the glass 10, the flat harness 20 placed on one side of the glass 10 at the end of the glass 10 (on the lower side in the figure), and the base layer 30B formed on the glass 10 and the flat harness 20. However, the glass structure 1B according to the second embodiment differs from the glass structure 1A of the first embodiment in that a sealant layer is provided as a part of the base layer 30B.

As illustrated in FIG. 7, in the glass structure 1B, the base layer 30B has the resin primer layer 32 formed on the surface (exposed surface) of the resin portion of the flat harness 20, the glass primer layer 34 formed on the surface of glass 10, and the sealant layer 36 disposed so as to cover the resin primer layer 32. More specifically, the surface of the flat harness 20, that is, the resin primer layer 32 is formed on the opposite surface to the surface facing the glass 10 and the end surface of the side portion. Then, the glass primer layer 34 is formed on the surface of the glass 10 extending to both sides of the flat harness 20 covered by the resin primer layer 32. Then, the sealant layer 36 is filled so as to cover the entire resin primer layer 32.

The sealant layer 36 is not particularly limited and can be selected depending on the type of adhesive, as long as the sealant layer 36 has plasticity capable of being molded into an arbitrary shape and can fill the gap to form airtightness and liquid tightness. For example, when the adhesive is a urethane adhesive, the sealant layer 36 preferably contains urethane as a main component. When the adhesive is a urethane adhesive, the sealant used in the sealant layer 36 includes WS-222, WS-292 (manufactured by Yokohama Rubber Co., Ltd.), #560 (manufactured by Sunstar Engineering Inc.), #8000 (manufactured by Dow Inc.), and the like.

In the vicinity of the place where the flat harness 20 is placed on the surface of the glass 10, a step may occur between the surface of the glass 10 and the surface of the flat harness 20. However, in the example illustrated in FIG. 7, the step between the surface of the glass 10 and the surface of the flat harness 20 is eliminated by using the sealant layer 36, resulting in that the surface become a curved surface and becomes smooth. More specifically, the thickness of the sealant layer 36 becomes thinner as the distance away from the flat harness (connecting member) 20 along the glass surface in a cross-sectional view in the thickness direction of the glass plate. In other words, the cross-sectional shape of the sealant layer 36 becomes wider toward the glass surface. Further, it is preferable that the contour of the cross-sectional shape of the sealant layer 36 is curved. By using the sealant layer 36 in this way, the adhesive can be reliably attached to the base layer 30B without a gap even in the portion where the flat harness 20 is placed when the glass structure 1B is attached. As a result, close adhesion with a predetermined member can be achieved.

Such glass structure 1B can be produced by placing the flat harness 20 on one surface of the glass 10, then the base layer 30B extending in a strip shape along the edge of the glass is formed on the surface of the glass 10 and the surface of the flat harness 20. In this case, the formation of the base layer 30B may contain forming the resin primer layer 32 on the surface of the flat harness 20, forming the glass primer layer 34 on the surface of the glass 10, and placing the sealant layer 36 on the resin primer layer 32.

In the glass structure 1B as an example illustrated in FIG. 7, after the flat harness 20 is placed, a resin primer is applied to the surface of the flat harness 20 (In flat harness 20, the surface opposite to the glass 10 and the end faces of both sides the flat harness 20) to form the resin primer layer 32. Then, the glass primer layer 34 was formed on the glass 10 of both sides of the resin primer layer 32 by applying a glass primer so as to contact with the resin primer layer 32. Subsequently, the sealant layer 36 was placed so as to cover the entire resin primer layer 32 and a portion of the glass primer layer 34 to produce the glass structure 1B of FIG. 7.

Figure 8:
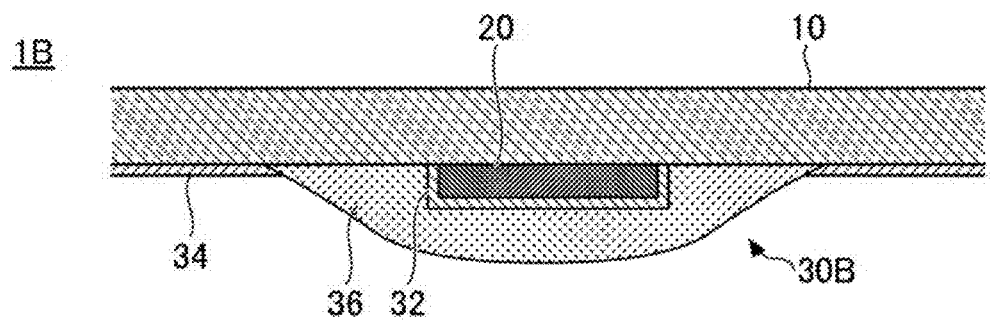
FIG. 8 is a cross-sectional view of the glass structure of the second embodiment.

FIG. 8 depicts a modification of the glass structure 1B. In the example illustrated in FIG. 7, the sealant layer 36 was provided on the entire resin primer layer 32 and a part of the glass primer layer 34. The example illustrated in FIG. 8 differs from the example of FIG. 7 in that a part of the sealant layer 36 was also formed on the glass 10. In the example illustrated in FIG. 8, the glass primer layer 34 is not in contact with the resin primer layer 32 but is in contact with the sealant layer 36.

In the glass structure 1B as an example illustrated in FIG. 8, after the flat harness 20 was placed, the resin primer layer 32 was formed by applying a resin primer on the surface of the flat harness 20 opposite to the glass 10 and the end faces of both sides of the flat harness 20. Then, the sealant layer 36 was placed so as to cover the resin primer layer 32. Subsequently, the glass primer layer 34 was formed by applying the glass primer layer so as to come into contact with the sealant layer 36, thereby forming the glass structure 1B of FIG. 8.

In the examples illustrated in FIGS. 7 and 8, the flat harness 20 and the glass 10 may be bonded with the double-sided adhesive tape as described in the example of FIG. 4. Further, as described in the example of FIG. 5, the resin primer is applied to the surface of the flat harness 20 facing the glass 10 (the resin primer is applied around the flat harness 20) so that the resin primer layer 32 can also be formed. In that case, the resin primer layer 32 can be formed before the flat harness 20 is placed along the surface of the glass 10. Furthermore, as described in the example of FIG. 6, before disposing the flat harness 20, the glass primer is applied to the glass 10 to form the glass primer layer 34 between the flat harness 20 and the glass 10.

Figure 9:
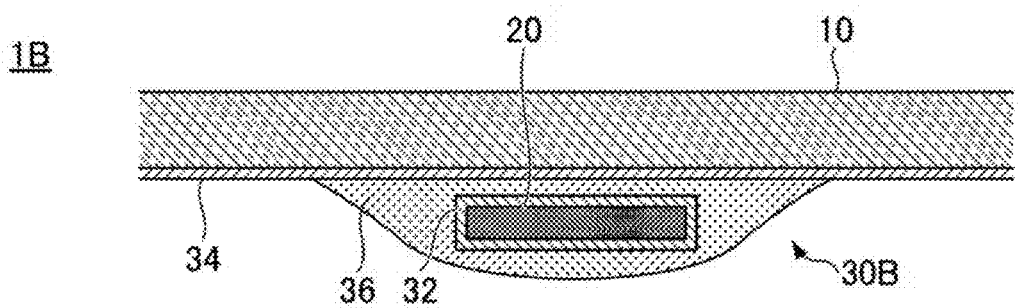
FIG. 9 is a cross-sectional view of the glass structure of the second embodiment.

FIG. 9 depicts another modification of the glass structure 1B. In the example illustrated in FIG. 9, the resin primer layer 32 was formed around the flat harness 20, and the glass primer layer 34 and the sealant layer 36 were placed between the flat harness 20 and the glass 10.

In the glass structure 1B as an example illustrated in FIG. 9, the glass primer layer 34 was formed by applying the glass primer on the glass 10 and a sealant was placed on the glass primer layer 34. Then, the flat harness 20, in which the resin primer layer 32 was formed in the periphery, was placed on the sealant layer 36. After that, a sealant was further placed above the flat harness 20 to produce the glass structure 1B of FIG. 9. In that case, the sealant layer 36 was formed so that no unevenness between the sealant layer disposed earlier and the sealant layer disposed later was form on the sealant layer 36. In addition, after the glass primer layer 34 was formed on the glass 10, the flat harness 20, in which the resin primer layer was placed on the periphery of the flat harness 20 and the sealant was placed thereon, was placed on the glass primer layer 34. Then, the shape of the sealant was properly arranged to form the sealant layer 36 to produce the glass structure 1B of FIG. 9.

In addition, a long-life primer can also be used as a glass primer used for the glass primer layer 34 in the second embodiment, and the same effect as explained in the first embodiment can be obtained.

As described above, the above-described embodiments (first embodiment and second embodiment) may also be used in combination.

The glass structure according to the embodiment described above can be used as window glass of vehicles such as automobiles, trains or the like, window glass of buildings, or window of containers or partitions. The glass structure of the present embodiment is preferably used as window glass of vehicles. Further, one embodiment of the present invention may have an adhesive structure in which the above-mentioned glass structure is adhered via an adhesive applied on the base layer.

DESCRIPTION OF THE REFERENCE NUMERALS 1A, 1B, 100, 200: Glass structure
20: Connecting member (flat harness)
21: Connection portion
22: Power supply portion
24: Resin portion
30, 30A, 30B: Base layer
32: Resin primer layer
34: Glass primer layer
36: Sealant layer
50: Double-sided adhesive tape
60: Adhesive
70: Connector
80: Frames
110, 210, 212: Glass plates
150, 250: Conductor
218: Laminated glass
215: Intermediate film

The invention claimed is:

1. A glass structure comprising:
a glass plate;
a connecting member which is placed on one surface of the glass plate, and is electrically connected to a conductor placed on the glass plate or placed in the vicinity of the glass plate, the connecting member including a connecting portion at one end thereof and a power supply portion at the other end thereof, and a portion other than the connecting portion and the power supply portion are covered by a resin portion;
wherein the glass structure is adhered to a portion of a frame by an adhesive; and
the glass structure comprising
a base layer extending as a strip along the edge of the glass plate is placed on the surface of the glass plate and the surface of the resin portion of the connecting member,
wherein the base layer consists of:
a resin primer layer formed on the surface of the resin portion of the connecting member, and
a glass primer layer formed on the surface of the glass plate; and
a sealant layer disposed on the resin primer layer.

2. The glass structure according to claim 1, wherein the thickness of the sealant layer becomes thinner as the distance away from the connecting member in a cross-sectional view in the thickness direction of the glass plate.

3. The glass structure according to claim 1, wherein a pot life of the glass primer used in the glass primer layer is 8 hours or more in accordance with JIS K6870.

4. The glass structure according to claim 1, wherein the adhesive is a urethane adhesive.

5. The glass structure according to claim 1, wherein the glass plate is adhered to the connecting member.

6. The glass structure according to claim 1, wherein a laminated glass is formed of the glass plate and another glass plate via an intermediate film, and the conductor is placed between the glass plate and the other glass plate.

7. The glass structure according to claim 6, wherein the one end of the connecting member that includes the connecting portion is placed between the glass plate and the other glass plate, and the other end of the connecting member including a power supply portion is located outside the laminated glass, and a portion of the connecting member is folded at the end of the laminated glass.

8. The glass structure according to claim 1, wherein the connecting member is a thin foil-like member.

9. The glass structure according to claim 1, wherein the glass structure is used for window glass for vehicles.

10. The glass structure according to claim 1, wherein the connecting member consists of one or a plurality of conducting wires are bundled and covered with the resin portion.

11. An adhesive structure wherein the glass structure according to claim 1 is attached to a frame via an adhesive applied on the base layer.

* * * * *